US010257933B1

(12) United States Patent
Hassemer et al.

(10) Patent No.: US 10,257,933 B1
(45) Date of Patent: Apr. 9, 2019

(54) TRANSVERSE CIRCUIT BOARD TO ROUTE ELECTRICAL TRACES

(71) Applicant: Google LLC, Mountain View, CA (US)

(72) Inventors: Brian Jon Hassemer, Gurnee, IL (US); Mark Daniel Janninck, Glen Ellyn, IL (US); David Kyungtag Lim, Glenview, IL (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 15/716,178

(22) Filed: Sep. 26, 2017

(51) Int. Cl.
| | |
|---|---|
| *H05K 1/14* | (2006.01) |
| *G06F 1/18* | (2006.01) |
| *H05K 1/18* | (2006.01) |
| *H05K 1/02* | (2006.01) |
| *H04N 5/225* | (2006.01) |

(52) U.S. Cl.
CPC ............. *H05K 1/141* (2013.01); *G06F 1/183* (2013.01); *H04N 5/2253* (2013.01); *H04N 5/2254* (2013.01); *H04N 5/2257* (2013.01); *H05K 1/028* (2013.01); *H05K 1/147* (2013.01); *H05K 1/18* (2013.01); *H05K 2201/09218* (2013.01); *H05K 2201/10151* (2013.01)

(58) Field of Classification Search
None
See application file for complete search history.

(56) References Cited

U.S. PATENT DOCUMENTS

| | | | |
|---|---|---|---|
| 5,544,015 A | 8/1996 | Akami | |
| 7,087,450 B2 * | 8/2006 | Choi | G01R 33/04 438/48 |
| 7,589,975 B2 * | 9/2009 | Ootani | H05K 1/028 361/749 |
| 7,772,841 B2 * | 8/2010 | Itoi | G01R 33/0011 324/244 |

(Continued)

FOREIGN PATENT DOCUMENTS

WO    WO 2012/020212     2/2012

OTHER PUBLICATIONS

PCT Invitation to Pay Additional Fees and, where applicable, Protest Fee, issued in International Application No. PCT/US2018/033300, dated Aug. 6, 2018, 23 pages.

(Continued)

*Primary Examiner* — Xanthia C Cunningham
(74) *Attorney, Agent, or Firm* — Fish & Richardson P.C.

(57) ABSTRACT

An electronic device including a transverse circuit board to route electrical traces is provided. In some embodiments, the electronic device includes: a housing; a first printed circuit board (PCB) that is fixed relative to the device housing; an integrated circuit that is connected to the first PCB; a second PCB that is situated in a transverse position relative to the first PCB, a plurality of electrical traces; and a securing component that secures the second PCB in the transverse position relative to the first PCB. Each respective electrical trace from the plurality of electrical traces includes: (i) a first portion that extends across the first PCB, between the integrated circuit and the second PCB, (ii) a second portion (Continued)

that extends across the second PCB, between the first PCB and either the first PCB or a third PCB, and (iii) a third portion that extends across either the first PCB or the third PCB, between the second PCB and a location other than the integrated circuit.

19 Claims, 6 Drawing Sheets

(56) References Cited

U.S. PATENT DOCUMENTS

| | | | |
|---|---|---|---|
| 8,476,532 B2 * | 7/2013 | Kitano | H05K 1/0215 |
| | | | 174/254 |
| 9,001,268 B2 | 4/2015 | Azuma et al. | |
| 9,538,662 B2 | 1/2017 | Besen et al. | |
| 9,641,733 B1 * | 5/2017 | Topliss | H04N 5/2254 |
| 2006/0017435 A1 * | 1/2006 | Kang | G01R 33/04 |
| | | | 324/249 |
| 2008/0170141 A1 | 7/2008 | Tam et al. | |
| 2011/0102667 A1 | 5/2011 | Chua et al. | |
| 2011/0111616 A1 * | 5/2011 | Chang | H05K 1/141 |
| | | | 439/329 |
| 2012/0120619 A1 * | 5/2012 | Kodera | H05K 1/0219 |
| | | | 361/749 |
| 2012/0218219 A1 | 8/2012 | Rappoport et al. | |
| 2012/0313859 A1 | 12/2012 | Apgar et al. | |
| 2014/0002385 A1 | 1/2014 | Ka et al. | |
| 2016/0174378 A1 * | 6/2016 | Johnson | H05K 1/147 |
| | | | 361/760 |

OTHER PUBLICATIONS

PCT International Search Report and Written Opinion issued in International Application No. PCT/US2018/033300, dated Oct. 1, 2018, 26 pages.

* cited by examiner

TRANSVERSE CIRCUIT BOARD TO ROUTE ELECTRICAL TRACES

BACKGROUND

Integrated circuits are often mounted to printed circuit boards ("PCBs"), and electrical traces that flow across the surface or through the interior of such PCBs may connect pins or pads of an integrated circuit to other electronic components (e.g., resistors, capacitors, sensors, and other integrated circuits) that are mounted to the PCB. Integrated circuits are typically located on a PCB far enough away from an edge of the PCB to provide space for the electrical traces that route electrical signals between the pins or pads of the integrated circuit and another electronic component. As the number of pins or pads on an integrated circuit increases, the space to accommodate the electrical traces that connect to those of pins or pad also increases.

SUMMARY

In general, this document describes techniques for assembling electronic components to reduce the space occupied by an integrated circuit and its associated electrical traces within a housing of a computing device. This reduction in space is accomplished by routing the traces associated with an integrated circuit in a direction that is transverse to the circuit board on which the integrated circuit is mounted. For example, instead of the traces flowing away from the integrated circuit on the circuit board in an entirely planar manner, at least some of the traces route upwards to flow in a direction that is not coplanar with the integrated circuit or the circuit board on which it is mounted, for example, due to the traces flowing onto one or more secondary circuit boards that are mounted to the primary circuit board in a transverse manner (e.g., orthogonal or substantially orthogonal to the primary circuit board).

By way of background, an integrated circuit is an electronic component that includes multiple circuit elements assembled into a single package and which includes multiple pins (or pads, but this disclosure often refers to only pins for simplicity) on different side edges of the integrated circuit. Typically, integrated circuits are mounted to a PCB that includes electrical conductors called traces, with those traces electrically connecting the pins of the integrated circuit to other circuit elements. The PCB may be rigid or may be flexible (a circuit board is often called a "flex" when it is flexible). Each of these types of PCBs can include multiple traces on a surface layer of the circuit board, and can also include multiple traces on each of one or more interior layers of the circuit board. The layers of the circuit board may be separated in the Z (vertical) direction with a non-conductive material, and each layer may occupy X-Y dimensions of the circuit board. A trace may route from one layer to another layer of a circuit board in the Z direction using a via. In some embodiments, the via includes a conductive tube that is placed within a hole to connect a first portion of a trace that flows across a first layer of a circuit board to a second portion of the trace that flows across a second layer of the circuit board. Although portions of a conductor/trace that are located on different layers may conceptually be considered different traces, this disclosure generally refers to portions of conductors on different layers (or even different circuit boards) that are electrically connected as a single conductor/trace. This is at least partially because the conductor forms a single path of transmission of electricity of a certain characteristic.

PCBs use traces to route electrical signals between pins of an integrated circuit and other circuit elements. The more complex the integrated circuit, the more pins on any given side of the integrated circuit, and the more space required on the circuit board for the traces. The space required by the traces becomes a constraint to the locations at which an integrated circuit can be placed. For example, integrated circuits are traditionally spaced far enough away from other complex circuitry or the edge of a circuit board to provide space for traces to route to various other components. In situations in which the integrated circuit is placed next to a barrier such as an edge of the circuit board or another integrated electronic device, the traces flowing out from the integrated circuit must be turned to the side and/or routed through vias to other layers (and often still turn) to avoid the barrier.

In some instances it may be helpful to reduce the space between the integrated circuit and the barrier. One example is when the integrated circuit is an imaging sensor that designers of a mobile computing device wish to place close to a side of the mobile computing device and thus near an edge of a circuit board. In such examples, one solution is to route the traces flowing away from the integrated circuit in the Z direction, for example, by (i) bending a first circuit board on which the integrated circuit is mounted so that part of the first circuit board is situated transverse to the portion of the first circuit board at which the integrated circuit is mounted or (ii) flowing the traces onto a second circuit board that is transverse to the first circuit board. The bent portion of the second circuit board or the second circuit board may be located less than 0.2 centimeters (cm), 0.5 cm, or 1.0 cm from the edge of the integrated circuit. For ease of description, this disclosure often refers to the bent portion of the circuit board as a second circuit board so that features that are common to "bent" circuit board and "two" circuit board implementations may be explained without repetition. As such, in some embodiments, the "second circuit board" is described herein is integral with the first circuit board (being a bent portion thereof), and in other implementations the second circuit board is separate from the first circuit board (being a different circuit board that may be attached to the first circuit board).

In some embodiments, the traces may route from the first circuit board onto the second circuit board, and then may return to the main body of the first circuit board. In some embodiments, one or more (e.g., all) of the traces that are routed onto the second circuit board do not connect to another electrical component until returning to the first circuit board (or only connect in series with a component that does not branch to other components, such as a resistor or diode inline with the trace). In other words, the transverse routing of traces onto the second circuit board may not connect the integrated circuit with electronic components that are vertically offset in the Z direction from the first circuit board, at least in some embodiments. Rather, the transverse routing of the traces onto the second circuit board may be performed solely to provide space for the traces to fan out and turn so that the traces can route to other electrical components, while still allowing the integrated circuit to be placed close to a boundary edge.

Various design options are available for transversely routing traces in the manner described above. A first design option includes selecting between flexible PCB technology and rigid PCB technology. With flexible circuit board implementations, the traces may be printed on the flexible circuit board and the integrated circuit may be mounted to the flexible circuit board much as they traditionally would, but an end portion of the flexible circuit board is bent upwards or downwards in the Z-direction. This allows the integrated circuit to be placed close to a barrier, such as a portion of the housing of computing device. In some embodiments, the end portion of the flexible circuit board that is bent may lie in a plane that is transverse to the main portion of the circuit board. As discussed above, this disclosure sometimes refers to this bent portion of the flexible circuit board as a second circuit board for the sake of simplicity.

In some embodiments, the bent portion of the flexible circuit board may be mounted to a separate component (e.g., a support substrate) to fix the bent portion of the circuit board in the transverse orientation. This separate component may be a portion of the housing of the computing device, and may have a planar surface that is coplanar with and attached to the bent portion of the flexible circuit board. The attachment between the separate component and the bent portion of the flexible circuit board may be achieved by using adhesive, solder, or one or more fasteners, for example. In some embodiments, the separate component to which the bent portion of the flexible circuit board is mounted is not part of the housing of the computing device. Rather, the separate component may connect to both the unbent and bent portions of the flexible circuit board. As such, the separate component may form a right angle, or nearly a right angle (e.g., an angle ranging between 70° and 110°), to retain the flexible circuit board in the bent position. As such, the separate component may connect to the unbent portion of the flexible circuit board at a first location and may separately connect to the bent portion of the flexible circuit board at a second location.

In rigid circuit board implementations, a second circuit board may be fixed transverse relative to the first circuit board, and traces may flow through connections between the first and second circuit boards. As described above, the transverse fixing of the circuit boards with respect to each other means that the circuit boards are orthogonal or substantially orthogonal (e.g., within 1, 3, 5, 10, or 20 degrees of orthogonal). As such, an edge of the second circuit board may abut a major planar surface of the first circuit board, or vice versa. The traces may flow from one circuit board to another through conductive pads that abut each other at a junction of the circuit boards, for example, with a conductive pad on a major planar surface of one of the circuit boards contacting a conductive pad on an edge of the other circuit board. For the circuit board that includes conductive pads on its face, the corresponding traces may run across that face of the circuit board. For the circuit board with conductive pads on its edge, the traces can either wrap from the pad around an external corner of the circuit board to the face of the circuit board or can route through an internal layer and then (using a via) to the face of the circuit board.

As an example, suppose that an edge of the second circuit board abuts a face of the first circuit board on which the integrated circuit is mounted. The edge of the second circuit board may include several conductive pads that contact corresponding conductive pads on the first circuit board (or interact through pin/pad arrangements, etc.). Some of the conductive pads on the second circuit board may for part of traces that are visible on a face of the second circuit board (e.g., the face that is directed towards the integrated circuit located on the first circuit board). These traces can flow to the face of the second circuit board by routing around the corner of the circuit board or internally through the second circuit board and then routing to the surface using a via. In some embodiments, the same trace may flow across the face of the second circuit board before routing to another, different conductive pad on the same edge of the second circuit board at which the previously discussed pad is located, using either vias or routing around the corner of the second circuit board. This trace may route through the different conductive pad back onto the first circuit board at a different location.

The secondary circuit board and the first circuit board may affix to each other in this transverse alignment using solder, adhesive, or one or more fasteners that connects the pads and/or pins of the two circuit boards (at least when the first and second circuit boards are separate, rigid circuit boards). A different or additional mounting technique involves using a separate mounting component to assist with rigidity, for example, a component that serves as a brace to connect both circuit boards.

A second design option includes selecting a circuit board to which the traces should route after flowing from the integrated circuit on the first primary circuit board to the second circuit board (e.g., whether that second circuit board is a bent portion of the first circuit board or a separate circuit board). One design option already discussed in some detail herein is to route the traces back onto the first circuit board. In this manner, at least some of the traces that route onto the second circuit board essentially loop back to the first circuit board. While routing across the second circuit board, the traces may not connect to an integrated circuit or other complex circuit element (e.g., a circuit element with more than 2, 3, 5, or 7 electrical pins). In fact, the second circuit board may include no such complex circuit element. In some embodiments, one or more of the traces may be attached to resistors, capacitors, inductors, or diodes on the second circuit board, but may not be attached to a complex circuit element on the second circuit board. Alternatively, one or more (e.g., all) of the traces may route across the second circuit board without attaching to any circuit element. As such, the transverse circuit board portion may not include a resistor, capacitor, inductor, or diode.

Another manner of routing traces after they have flowed onto the second circuit board is to route those traces to a third circuit board. In some embodiments that third circuit board is oriented so that traces flowing across the third circuit board route back in a direction towards the integrated circuit on the first circuit board. Such a configuration allows traces to flow from the integrated circuit across the first circuit board, move into a transverse direction on the second circuit board, and then instead of flowing back onto the first circuit board, flow onto the third circuit board, which runs at least partially in the same direction as the first circuit board. This third circuit board may be mounted orthogonal to the second circuit board in at least three different configurations. For example, the third circuit board may be coplanar with the first circuit board such that the third circuit board is suspended overhead the first circuit board. The third circuit board may also be coplanar with the first circuit board such that the third circuit board is adjacent the first circuit board and lying in the same plane but potentially separated by open space in that plane. The third circuit board may alternatively be orthogonal to the first circuit board to potentially form a box corner between the first circuit board, second circuit board, and third circuit board. One or more of the traces that flow onto the third circuit board may flow back onto the first circuit board without interacting with any integrated circuit or other complex circuit, as described above.

All in all, the disclosure provided above explains some example embodiments for routing traces in a transverse direction, typically for the purpose of freeing up space in the X-Y plane of the first circuit board and/or to enable an integrated circuit to be placed closer to a boundary. Such implementations can move some components (e.g., traces) in the Z direction to utilize space that may otherwise remain unused in a computing device. A specific benefit of the implementation described herein enables a smartphone to include an imaging sensor close to an edge of the mobile device, which can maximize the amount of space available for a display device on a front surface of the smartphone.

As additional description to the embodiments described below, the present disclosure describes the following embodiments.

Embodiment 1 is a mobile computing device, the device comprising: a device housing; a first printed circuit board that is fixed relative to the device housing; an integrated circuit that is connected to the first printed circuit board; a second printed circuit board that is situated in a transverse position relative to the first printed circuit board; a plurality of electrical traces; and a securing component that secures the second printed circuit board in the transverse position relative to the first printed circuit board. Each respective electrical trace from the plurality of electrical traces includes: (i) a first portion that extends across the first printed circuit board, between the integrated circuit and the second printed circuit board, (ii) a second portion that extends across the second printed circuit board, between the first printed circuit board and either the first printed circuit board or a third printed circuit board, and (iii) a third portion that extends across either the first printed circuit board or the third printed circuit board, between the second printed circuit board and a location other than the integrated circuit; and Embodiment 2 is the mobile computing device of embodiment 1, wherein the integrated circuit comprises an imaging sensor.

Embodiment 3 is the mobile computing device of embodiment 2, wherein the securing component further secures an imaging filter or imaging lens in front of the imaging sensor.

Embodiment 4 is the mobile computing device of any one of the preceding embodiments, wherein: the first printed circuit board comprises a first portion of a flexible printed circuit board; the second printed circuit board comprises a second portion of the flexible printed circuit board; and the second portion of the flexible printed circuit board is situated in the transverse position relative to the first portion of the flexible printed circuit board.

Embodiment 5 is the mobile computing device of embodiment 4, wherein the securing component that secures the second portion of the flexible printed circuit board in the transverse position relative to the first portion of the flexible printed circuit board attaches to the second portion of the flexible printed circuit board at a surface of the securing component that has a transverse orientation relative to the first portion of the flexible printed circuit board.

Embodiment 6 is the mobile computing device of any one of embodiments 1 through 3, wherein: the first printed circuit board comprises a rigid first printed circuit board; the second printed circuit board comprises a rigid second printed circuit board that is different from the rigid first printed circuit board; and the rigid second printed circuit board is situated in the transverse position relative to the rigid first printed circuit board.

Embodiment 7 is the mobile computing device of embodiment 6, wherein the securing component that secures the rigid second printed circuit board in the transverse position relative to the rigid first printed circuit board includes a fastener or adhesive or solder that secures an edge of the rigid second printed circuit board to a major face of the rigid first printed circuit board.

Embodiment 8 is the mobile computing device of embodiment 7, wherein, for each of the plurality of electrical traces, the second portion of the respective electrical trace extends from the edge of the rigid second printed circuit board to a major face of the rigid second printed circuit board without running through an interior of the second rigid printed circuit board.

Embodiment 9 is the mobile computing device of embodiment 7, wherein, for each of the plurality of electrical traces, the second portion of the respective electrical trace extends from the edge of the rigid second printed circuit board to a major face of the rigid second printed circuit board through an interior of the second rigid printed circuit board.

Embodiment 10 is the mobile computing device of any one of embodiments 1 through 3, and 6 through 9, wherein, for each of the plurality of electrical traces, the second portion of the respective electrical trace extends across the rigid second printed circuit board without connecting to an electrical component.

Embodiment 11 is the mobile computing device of any one of the preceding embodiments, wherein: for each electrical trace in a first subset of the plurality of electrical traces, the second portion of the respective electrical trace turns in a first direction on the second printed circuit board; for each electrical trace in a second subset of the plurality of electrical traces, the second portion of the respective electrical trace turns in a second direction on the second printed circuit board; the second direction is opposite the first direction.

Embodiment 12 is the mobile computing device of any one of the preceding embodiments, wherein each of the plurality of electrical traces includes: the second portion of the respective electrical trace that extends across the second printed circuit board, between the first printed circuit board and the first printed circuit board; and the third portion of the respective electrical trace that extends across the first printed circuit board, between the second printed circuit board to the location other than the integrated circuit.

Embodiment 13 is the mobile computing device of any one of the preceding embodiments, wherein each respective electrical trace of the plurality of electrical traces includes: the second portion that extends across the second printed circuit board, between the first printed circuit board and the third printed circuit board; and the third portion that extends across the third printed circuit board, between the second printed circuit board and a location other than the integrated circuit.

Embodiment 14 is the mobile computing device of embodiment 13, wherein: the third printed circuit board is situated in a transverse position relative to the second printed circuit board; and the third printed circuit board is situated in a coplanar position relative to the first printed circuit board.

Embodiment 15 is the mobile computing device of embodiment 13, wherein: the third printed circuit board is situated in a transverse position relative to the second printed circuit board; and the third printed circuit board is situated in a transverse position relative to the first printed circuit board.

Embodiment 16 is an assembly of electrical components, the assembly comprising: a first printed circuit board that is fixed relative to the device housing; an imaging sensor that is connected to the first printed circuit board; a second printed circuit board that is situated in a transverse position relative to the first printed circuit board, a plurality of electrical traces, wherein each respective electrical trace from the plurality of electrical traces includes: (i) a first portion that extends across the first printed circuit board, between the integrated circuit and the second printed circuit board, (ii) a second portion that extends across the second printed circuit board, between the first printed circuit board and the first printed circuit board, wherein the second portion of the respective trace extends across the second printed circuit board without connecting to an electrical component, and (iii) a third portion that extends across the first printed circuit board, between the second printed circuit board and a location other than the integrated circuit; and a securing component that secures the second printed circuit board in the transverse position relative to the first printed circuit board, wherein: each electrical trace in a first subset of the plurality of electrical traces turns in a first direction on the second circuit board, and each electrical trace in a second subset of the plurality of electrical traces turns in a second direction on the second circuit board that is different from the first direction.

Embodiment 17 is the assembly of electrical components of embodiment 16, wherein: the first printed circuit board comprises a first portion of a flexible printed circuit board; the second printed circuit board comprises a second portion of the flexible printed circuit board; wherein the second portion of the flexible printed circuit board is situated in the transverse position relative to the first portion of the flexible printed circuit board.

Embodiment 18 is the assembly of electrical components of embodiment 16 or 17, wherein: the first printed circuit board comprises a rigid first printed circuit board; the second printed circuit board comprises a rigid second printed circuit board that is different from the rigid first printed circuit board; and the rigid second printed circuit board is situated in the transverse position relative to the rigid first printed circuit board.

Embodiment 19 is the assembly of electrical components of embodiment 18, wherein, for each of the plurality of electrical traces, the second portion of the respective electrical trace runs from the edge of the rigid second printed circuit board to a major face of the rigid second printed circuit board without running through an interior of the second rigid printed circuit board.

Embodiment 20 is the assembly of electrical components of any one of embodiments 16 through 19, wherein each respective electrical trace of the plurality of electrical traces includes: the second portion that extends across the second printed circuit board, between the first printed circuit board and the third printed circuit board; and the third portion that extends across the third printed circuit board, between the second printed circuit board and a location other than the integrated circuit.

The details of one or more embodiments are set forth in the accompanying drawings and the description below. Other features and advantages will be apparent from the description and drawings, and from the claims.

DESCRIPTION OF THE DRAWINGS

The details of one or more embodiments are set forth in the accompanying drawings and the description below, and wherein.

DETAILED DESCRIPTION

Figure 1:
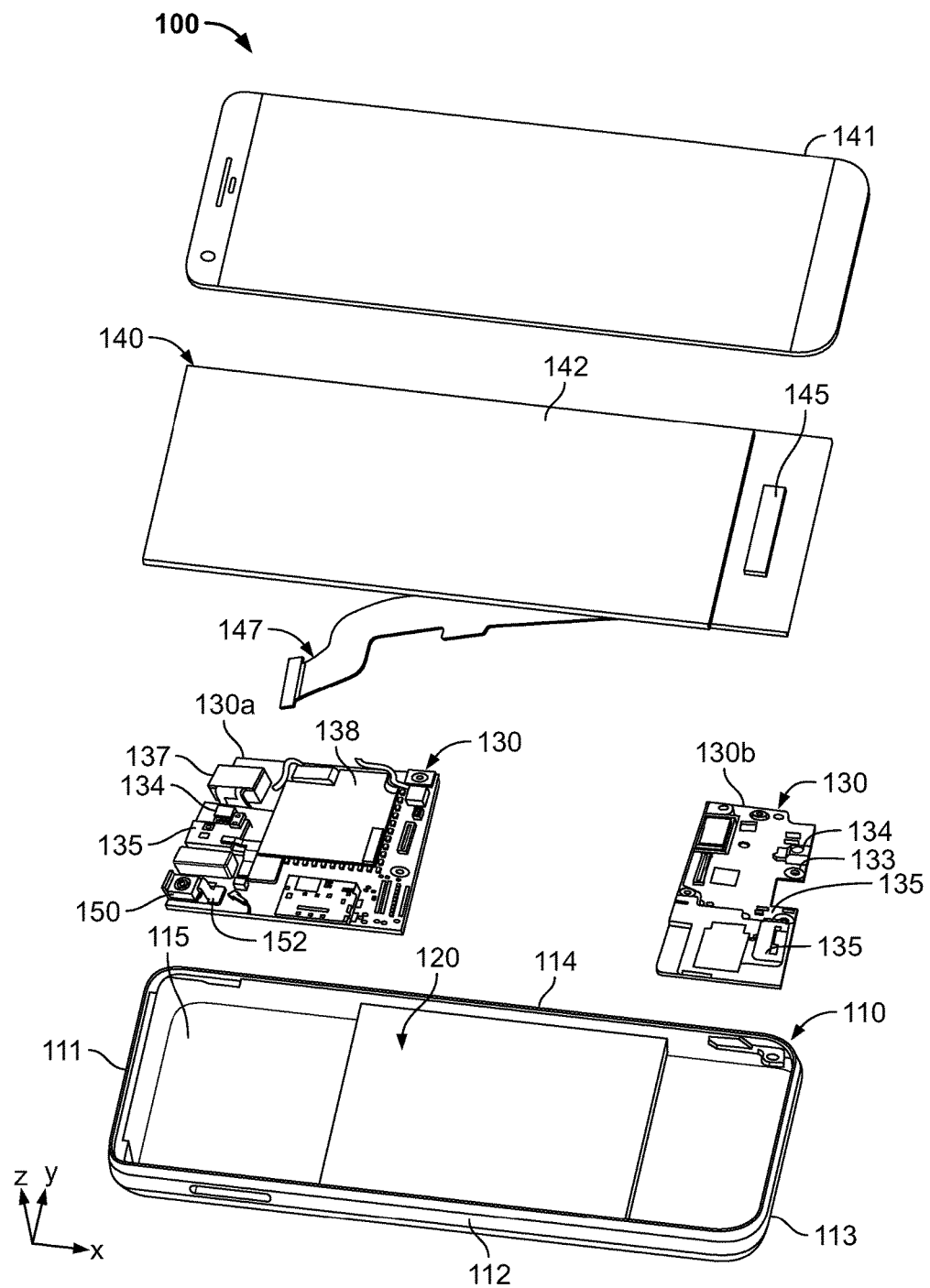
FIG. 1 shows a perspective exploded view of an electronic device that includes an imaging sensor assembly.

Referring to FIG. 1, an example electronic device 100 is shown, including an electronic device housing 110, a battery 120, a circuit board 130, a display assembly 140, and an imaging sensor assembly 150. Electronic components, such as imaging sensor assembly 150, can be configured to reduce the amount of space that the assembly requires within electronic device 100, by arranging components in a three-dimensional arrangement within electronic device 100.

Electronic device housing 110 and an outer cover 141 define an interior volume that can house various components of electronic device 110, including battery 120, circuit board 130, display assembly 140, and imaging sensor assembly 150. Housing 110 can accommodate additional components of electronic device 100, such as microphone 133, speaker 134, sensors 135, such as fingerprint sensors, proximity sensors, accelerometers, and/or other sensors, flash devices 137, processor 138, and/or other components. In various embodiments, some or all of these components are electrically connected with circuit board 130.

Electronic device housing 110 provides a bucket-type enclosure having first, second, third, and fourth side portions 111, 112, 113, 114 that define outer sidewalls of electronic device 100, and a back major planar face 115 integrally formed with side portions 111, 112, 113, 114. A bucket-type enclosure allows components of electronic device 100 to be accommodated within housing 110 and enclosed by an outer cover, such as outer cover 141. In other embodiments, one or more side portions and/or back major planar face 115 may be formed separately and subsequently joined together (e.g., with one or more adhesives, welds, snap-fit connectors, fasteners, etc.). In various embodiments, electronic device housing 110 may be an H-beam type housing or other electronic device housing 110 that includes one or more walls that provide a housing to at least partially support and/or enclose components of electronic device 100.

Electronic device housing 110 is made from a material that provides adequate structural rigidity to support and protect internal components of electronic device 100. In an example embodiment, electronic device housing 110 is formed from a single piece of metal. Electronic device housing 110 may be milled, molded, forged, etched, printed, or otherwise formed. Alternatively or additionally, electronic device housing 110 may be formed from plastic, glass, wood, carbon fiber, ceramic, combinations thereof, and/or other materials.

Circuit board 130 is configured to accommodate components of electronic device 100 in a space-efficient manner, and provide robust mechanical and electrical connections between these components, such as one or more of microphone 133, speaker 134, sensors 135, imaging sensor assembly 150, flash devices 137, processor 138, and/or other components. In some embodiments, circuit board 130 include a top circuit board 130a, and a bottom circuit board 130b, arranged at respective top and bottom end regions of electronic device 100, for example. Top and bottom circuit boards 130a, 130b are separately formed circuit boards and may be electrically connected by an electrical conductor. In other embodiments, top and bottom circuit boards 130a, 130b may be integrally formed as a unitary circuit board (e.g., joined by a third circuit board extending between top and bottom circuit boards 130a, 130b).

Battery 120 may be positioned adjacent to top and/or bottom circuit boards 130a, 130b such that battery 120 is positioned substantially centrally between a top and bottom of electronic device 100 (e.g., between top and bottom sidewalls 111, 113). In other embodiments, battery 120 may be positioned in a stacked configuration such that circuit boards 130a and/or 130b are between battery 120 and display assembly 140 (e.g., sandwiched between battery 120 and display assembly 140), or vice versa.

Battery 120 provides a primary source of power for electronic device 100 and its components. Battery 120 may include a secondary cell, rechargeable battery configured for use through thousands of battery charging cycles over the entire useful life of electronic device 100, for example. In various embodiments, battery 120 may be a lithium polymer battery, lithium ion battery, nickel metal hydride battery, nickel cadmium battery, or other battery type configured to power electronic device 100 over many charging cycles. Alternatively or additionally, battery 120 may include a primary cell battery configured to be replaced when substantially discharged.

Display assembly 140 provides a user interface display that displays information to a user. For example, display assembly 140 may provide a touch screen display that a user can interact with to view displayed information and to provide input to electronic device 100. In some embodiments, display assembly 140 occupies substantially all or the majority of a front major face of electronic device 100, and includes a rectangular visible display.

Display assembly 140 may include one or more substrate layers that provide the visible display and/or allow display assembly 140 to receive touch input from a user. For example, outer cover 141 may serve as an outermost layer that encloses other components of display assembly 140 and electronic device 100 and that a user may physically touch to provide input to electronic device 100. In some embodiments, display assembly 140 includes a liquid crystal display (LCD) panel 142 including a liquid crystal material positioned between one or more color filter and thin-film-transistor (TFT) layers. The layers of display panel 142 may include substrates formed from glass or polymer, such as polyamide. In various embodiments, display assembly 140 may be a light-emitting diode (LED) display, an organic light-emitting diode (OLED) display, such as an active-matrix organic light-emitting diode (AMOLED) display, a plasma display, an electronic ink display, or other display that provides visual output to a user.

Display assembly 140 may include driver circuitry used to control display output and/or receive user input. In some embodiments, driver circuitry includes a display integrated circuit 145 that is mounted in electrical communication with the TFT layers of display panel 142, for example by gate lines or other electrical connection. Display integrated circuit 145 may receive display data from processor 138, for example, and deliver corresponding signals to control the optical properties of a liquid crystal layer, for example, to produce a display output. A flex conductor 147 electrically connects display assembly 140 with circuit board 130 to provide transfer of data and power between display assembly 140 and circuit board 130.

Imaging sensor assembly 150 includes electronic components configured to capture, store, and transmit images, such as still photographs and image sequences. As will be discussed in greater detail in FIG. 2, imaging sensor assembly 150 can configured to reduce the amount of space required to accommodate the sensor assembly within electronic device 100, and to facilitate a flexible arrangement of its electronic components, connectors, and electric lines within electronic device 100. In particular, imaging sensor assembly 150 can include electronic components (e.g., PCBs or other components) that are transversely coupled such that electrical lines (e.g., traces) extend along a vertical plane as well as along a horizontal plane. Transversely coupled electronic components can reduce the amount of space used within electronic device 100 by facilitating flexibility in a three-dimensional arrangement of its electronic components within electronic device 100.

A flexible PCB ("flex") 152 electrically connects imaging sensor assembly 150 with circuit board 130 to transfer data and power between imaging sensor assembly 150, and circuit board 130. In some embodiments, electronic connectors such as integrated circuits, pads, and pins can be used to connect imaging sensor assembly 150, flex 152, and circuit board 130 together. Flex 152 includes conductive structures on a thin, flexible substrate. Flex conductor 152 has a relatively thin profile and may be bent along a longitudinal direction to fit between various components of electronic device 100. Conductive structures of flex conductor 152 may include conductive lines, printed conductive traces, or other conductive components that provide electrical connection between respective electrical contacts associated with imaging sensor assembly 150 and circuit board 130. Flex conductor 152 may be a single, double, or multi-layer flexible printed circuit including a polyamide, PEEK, polyester, having printed or laminated conductive elements, for example. Such construction provides robust electrical characteristics that can provide reliable connection between various components while having a low bending radius that facilitates compact arrangement of flex conductor 151 within electronic device 100.

Electronic connectors such as integrated circuits, pads, and pins can connect imaging sensor assembly 150, flex 152, and circuit board 130 together in a manner that facilitates a robust electrical connection while maintaining a space-efficient and low profile configuration that does not significantly increase the overall dimensions of electronic device 100.

Electronic device 100 may be an electronic device including a display assembly, such as a mobile computing device. Examples of mobile computing devices include a mobile phone, music player, tablet, laptop computing device, wearable electronic device, data storage device, display device, adapter device, desktop computer, or other electronic device.

Figure 2:
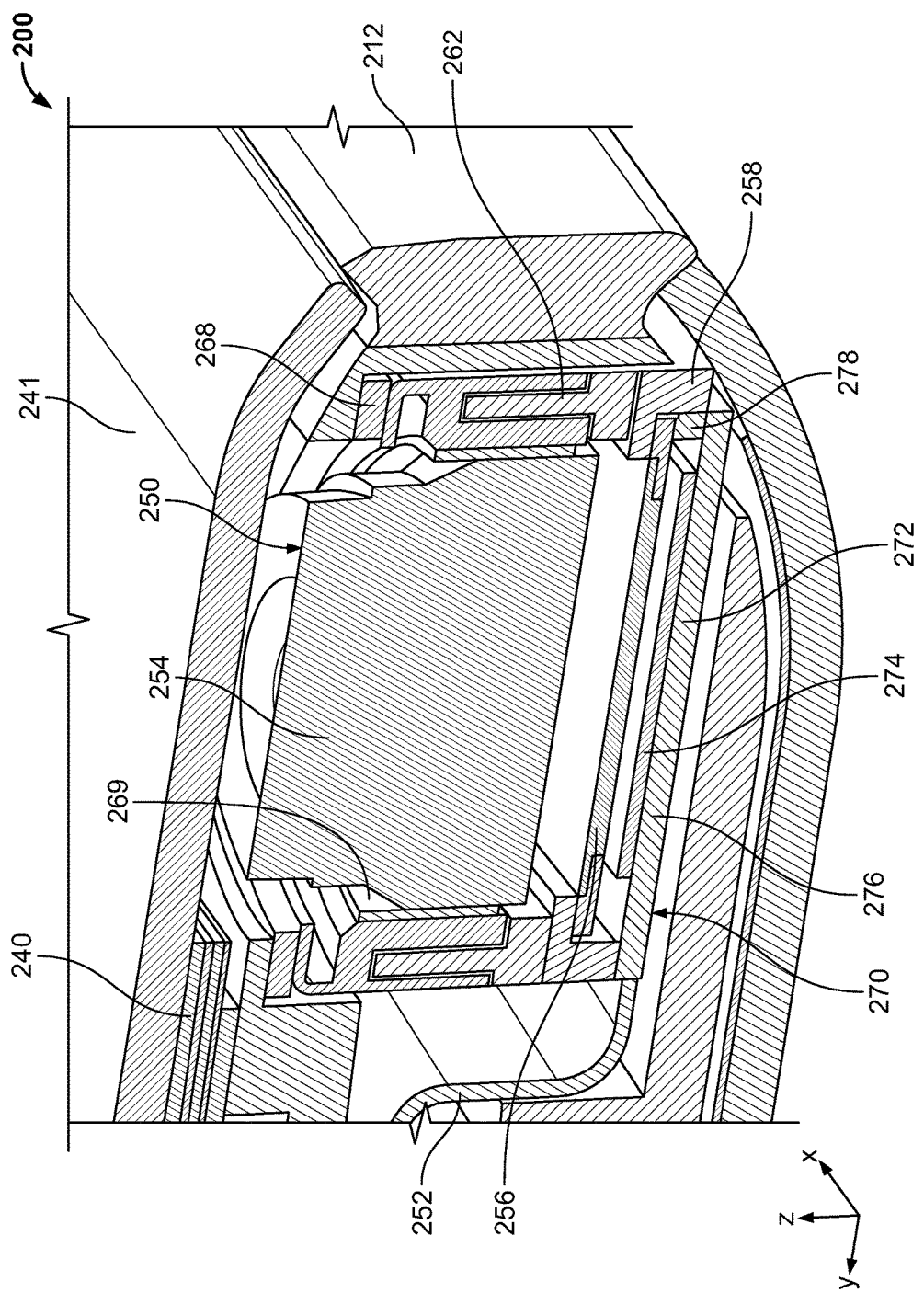
FIG. 2 shows a cross-sectional perspective view of an imaging sensor assembly within an electronic device.

Referring to FIG. 2, an example imaging sensor assembly 250 (e.g., camera) within an electronic device 200 is shown. Imaging sensor assembly 250, as depicted, is located within a device housing 210 between an outer cover 241 and a back major planar face 215, and is adjacent to a display assembly 240. Imaging sensor assembly 250, as depicted, can be positioned within electronic device 200 such that imaging sensor assembly 250 abuts a side wall portion 212 of housing 210. Imaging sensor assembly 250 is an optical component configured to capture, store, and transmit images, such as still photographs and image sequences (e.g., videos or movies).

Imaging sensor assembly 250 can include a lens module 254, a lens housing 260, and a PCB assembly 270. Lens module 254 can be partially enclosed within lens housing 260 and positioned vertically above PCB assembly 270 in various embodiments.

Lens module 254 can include one or more lens to capture light from an image object and to focus images. Lens module 254 can provide the basic functions associated with a camera lens and can also include a light source (e.g., light emitting diode) to provide a flash, when desired. Lens module 254 can also be configured to perform various filtering and image altering functions (e.g., color emitting, focusing, etc.) of captured images. In some embodiments, lens module 254 can include one, two, three, four, five, six, seven, eight, nine, ten, or more than ten lenses. In some embodiments, lens module 254 can include at least one imaging filter lens 256 and an optional securing component 258 to secure to the imaging filter lens 256 (and/or imaging lens) in a vertically elevated position relative to an integrated circuit (e.g., imaging sensor) contained in the PCB assembly 270.

Still referring to FIG. 2, lens housing 260 provides a body having first and second side portions 262, 264 that define housing sidewalls to receive lens module 254 within electronic device 200. Lens housing 260 allows components of lens module 254 to be accommodated within a device housing 210 while being enclosed by an outer cover of electronic device 200, such as an outer top cover 241 of device 200. Lens housing 260 also includes a top portion 268 defining an aperture 269 such that lens housing 260 can receive a majority portion of lens module 254 while allowing at least a small portion of lens module 254 (e.g., a telescoping portion) to extend in and/or through aperture 269. In other embodiments, one or more side portions 262, 264 may be formed of different materials (e.g., insulative plastic components with metal inserts) or components that are joined together (e.g., with one or more adhesives, welds, snap-fit connectors, fasteners, injection molded, etc.). In various embodiments, lens housing 260 may include other electronic device housing components, such as one or more walls 265 that at least partially support, electronically connect, and/or enclose lens module 254 within electronic device 200. Lens housings can include various suitable shapes (e.g., rectangular, disk-shaped, any polygonal, or irregularly shaped) and dimensions (e.g., a desired length, width, and height).

Still referring to FIG. 2, PCB assembly 270 includes a first PCB 272, a flexible PCB ("flex") 252, and an integrated circuit 274. First PCB 272 can be fixed relative to device housing 210. First PCB 272 can include a primary portion 276 and an extension portion 278 that is positioned transverse to primary portion 276, and can optionally be electronically coupled to flex 252. The primary portion 276 and the extension portion 278 can be different, rigid PCBs, or can be different portions of a flexible PCB. Primary and extension portions 276, 278 of the PCB 272 accommodate electrical tracings of integrated circuit 272 in an efficient manner, by utilizing space along X-Z or Y-Z planes within electronic device 200. This efficiency can allow space along an X-Y plane of the PCB 272 to be reduced, or applied to other uses. As illustrated in FIG. 2, extension portion 278 allows for a reduction in size of a portion of primary portion 267, such that the imaging sensor 250 can be located closer to side portion 212 of housing 210, and so that the entire imaging sensor assembly 250 can partially conform to curvature of back major planar face 215.

Figure 3A:
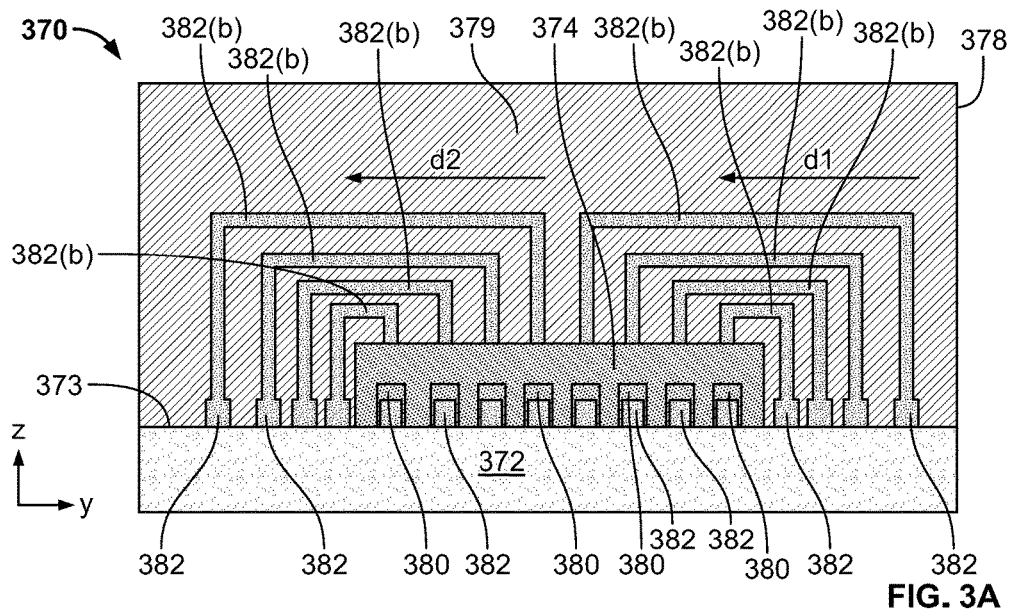
FIGS. 3A-3C front, plan, and side views, respectively, of a PCB assembly including a transverse circuit board.
Figure 3B:
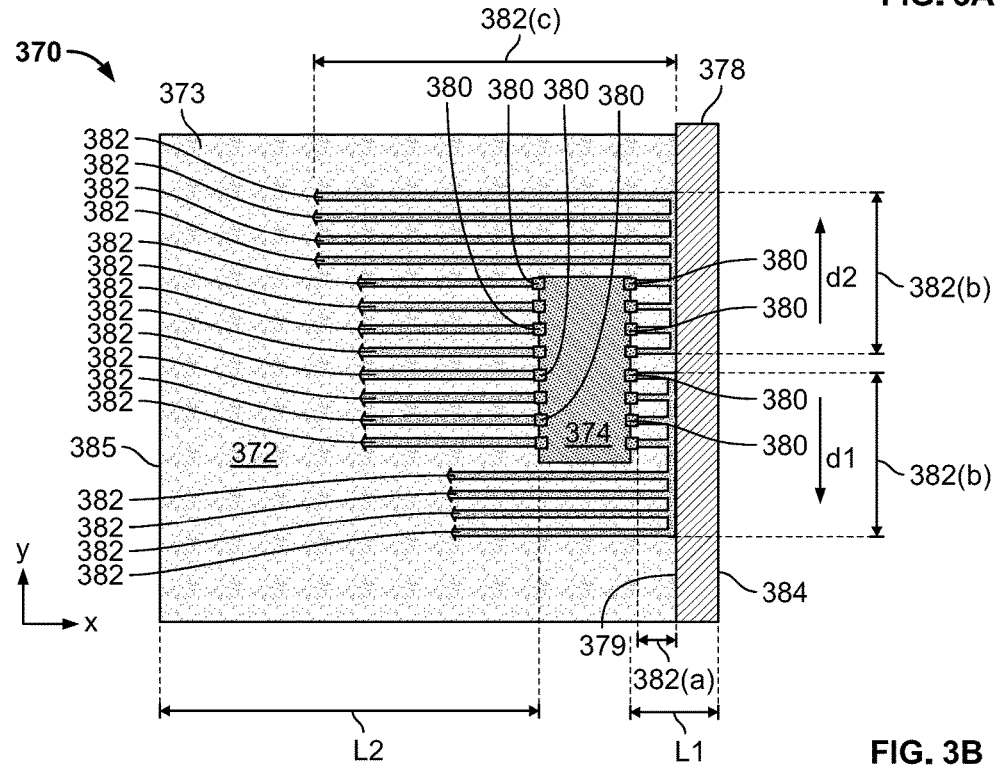
Figure 3C:
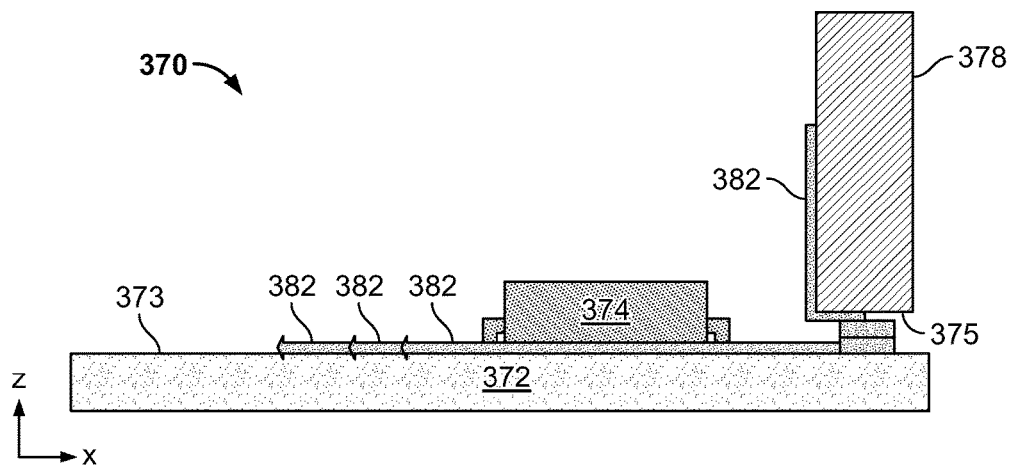

Referring to FIGS. 3A-3C, an example PCB assembly 370 is shown in which FIGS. 3A and 3B provide front and plan views, respectively, of PCB assembly 370 and FIG. 3C provides a side view of PCB assembly 370. PCB assembly 370 includes a first PCB 372, an integrated circuit 374, a second PCB 378, and a plurality of electrical traces 382. As shown, depicted second PCB 378 is situated in a transverse position relative to first PCB 372. Transverse structures, such as second PCB 378, allow printed circuit board assembly 370 to carry electrical traces 382 in a three-dimensional configuration.

First PCB 372 has a major face 373 defined along an X-Y plane. First PCB 372 can be coupled along its major face 373 to integrated circuit 374 and second PCB 378. First PCB 372 can be a rigid circuit board. In some embodiments, first PCB 372 can be a flexible PCB, or a combination of rigid and flexible PCBs.

Second PCB 378 has a major face 379 that is transverse to major face 373 of first PCB 372. In various embodiments, second PCB 378 can extend transverse to major face 373 of first PCB 372 such that the planar major faces 377, 379 of second PCB 378 are defined along either a X-Z plane, or a Y-Z plane. Second PCB 378 can be positioned in any desired location along major face 373 of first PCB 372. As shown in FIG. 3A, second PCB 378 can be positioned near one of the side ends 375 of first PCB 372, or along a peripheral edge of first PCB 372. In some embodiments, second PCB 378 can be positioned within a central region of major face 373 of first PCB 372. Second PCB 378 can be a rigid circuit board, a flexible PCB, or combinations thereof.

Figure 6:
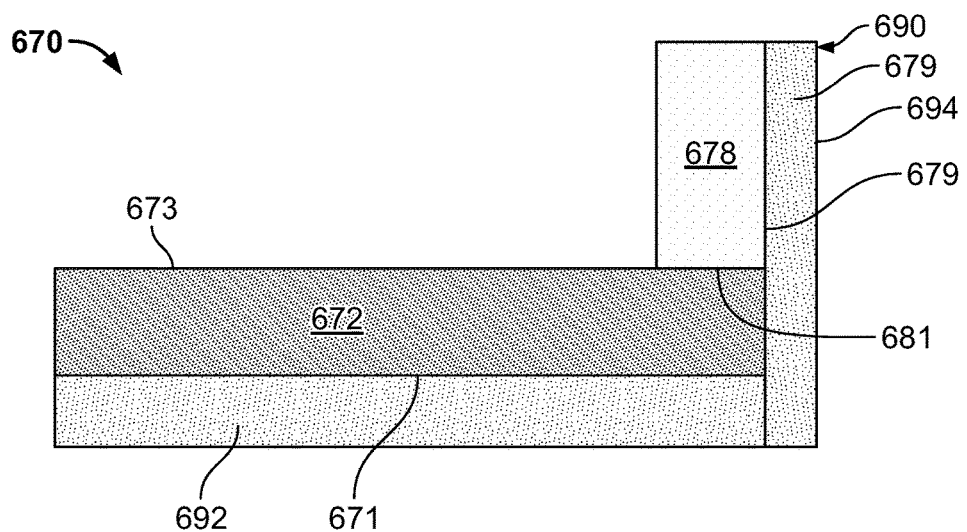
FIG. 6 shows a side view of a flexible PCB assembly that includes a securing component.
Figure 7:
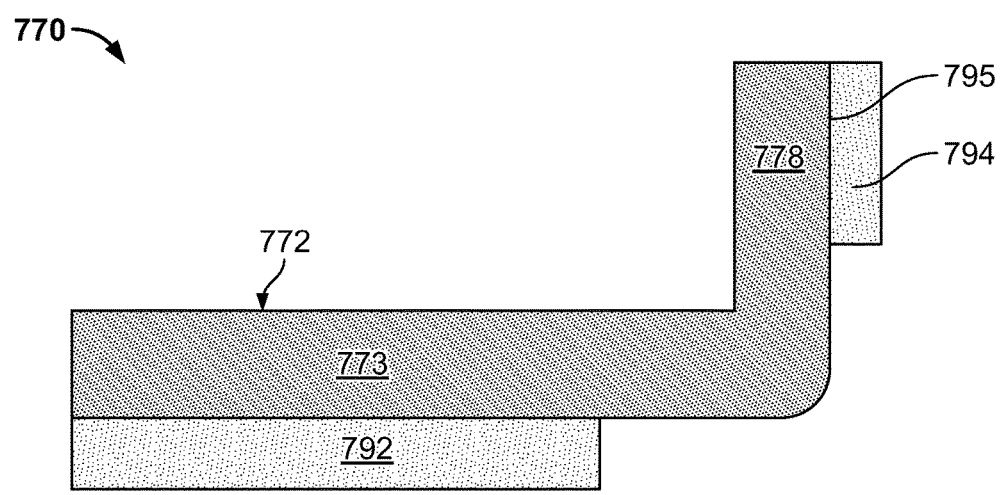
FIG. 7 shows a side view of a flexible PCB assembly that includes multiple securing components.

In some embodiments, first PCB 372 is a first portion of a flexible PCB and second PCB 278 is a second portion of the flexible PCB (e.g., see FIGS. 6 and 7). In such embodiments, the first and second PCBs are integrally connected (not shown in FIGS. 3A-C) rather than being separate, discrete PCBs (shown in FIGS. 3A-C). The second portion of the flexible PCB can be situated in a transverse position relative to a first portion of the flexible PCB by bending the flexible PCB at a desired angle (e.g., approximately 90 degrees). In such embodiments, a bend in the flexible PCB allows a second portion of the flexible PCB to be positioned transverse to a first portion of flexible PCB.

Still referring to FIGS. 3A-3C, integrated circuit 374 is an electronic component that includes the plurality of external connectors 380 (e.g., pins or pads) that electrically connect to a corresponding plurality of electrical traces 382. Integrated circuit 374 can be disposed on major face 373 of first PCB 372. In some embodiments, integrated circuit 374 can include a sensor, for example, an imaging sensor. Integrated circuit 374 can be coupled to first PCB 372 through various coupling options, such as adhesive bonding, soldering, heat bonding, and/or using one or more mechanical fasteners.

Electrical traces 382 of PCB assembly 370 can include one or more portions extending through different pathways to and/or from first PCB 372, second PCB 378, and integrated circuit 374, as well as optionally other electronic components within an electronic device (e.g., another PCB or electrical component). For example, an electrical trace 382 can include a first portion 382(a), a second portion 382(b), and a third portion 382(c). As best shown in FIG. 3B, the first portion 382(a) of the electrical trace 382 can extend across first PCB 372, between integrated circuit 374 and the second PCB 378. The second portion 382(b) of the electrical trace 382 can extend across the second PCB 378, between the first PCB 372 and back to the first PCB 378. In some embodiments, the second portion of the electrical trace 382 can extend across the second PCB 378, between the first PCB 372 and a third PCB (e.g., see FIG. 5A). The third portion 382(c) of electrical trace 382 can extend across first PCB 372 from second PCB 378 to a location other than integrated circuit 374 (e.g., another electronic component).

For each collection of the plurality of electrical traces 382 that flow away from an integrated circuit, some of the traces 382 may branch to one side and other of the traces may branch to another side. For example, for each of a first collection of the plurality of electrical traces 372, second portion 382(b) of the respective electrical trace can turn in a first direction "d1" (see depicted arrow in FIGS. 3A-3B) on second PCB 378. In another example, for each of a second collection of the plurality of electrical traces 372, second portion 372(b) of the respective electrical trace can turn in a second direction "d2" (see depicted arrow in FIGS. 3A-3B) on second PCB 378, in which second direction d2 is opposite the first direction d1.

Transverse structures, such as second PCB 378, provide PCB assembly 370 with the benefit of utilizing and carrying electrical tracing 382 in a three-dimensional configuration such that integrated circuit 374 can be positioned near a first side edge 384 of first PCB 372. As best shown in FIG. 3B, integrated circuit can be positioned on first PCB 372 such that closest side edge 384 of integrated circuit is a first length L1" away from first side edge 384 of first PCB 372. First length L1 is a substantially shorter than a second length "L2," which is defined between an opposite, second side edge of integrated circuit 374 and corresponding opposite, second side edge 385 of first PCB 372. Second PCB 378 permits electrical traces 382 to extend transversely along major face 379 of second PCB 378, thus allowing electrical traces 382 to extend out along first length L1 with sufficient space to be appropriately routed back to primary circuit board 372 (or other locations within the electronic device).

In some embodiments, at least some of the electrical traces 382 route through an interior of the first circuit board 372 and/or the second circuit board 378. For example, these circuit boards may include one or more internal layers through which traces can route, due to limited space on the surface of the circuit boards. In some embodiments, only some of the traces 382 that flow from pins of integrated circuit 374 are routed in the transverse direction. For example, the traces 382 that flow out of the left side of integrated circuit 374 (from the perspective shown in FIG. 3B) are not routed in the transverse direction. Moreover, some of the traces that flow from the right side of the integrated circuit 374 need not route in the transverse direction (e.g., those closest to the edge of the integrated circuit 374 may simply turn around the edge of the integrated circuit and flow in the other direction).

Figure 4:
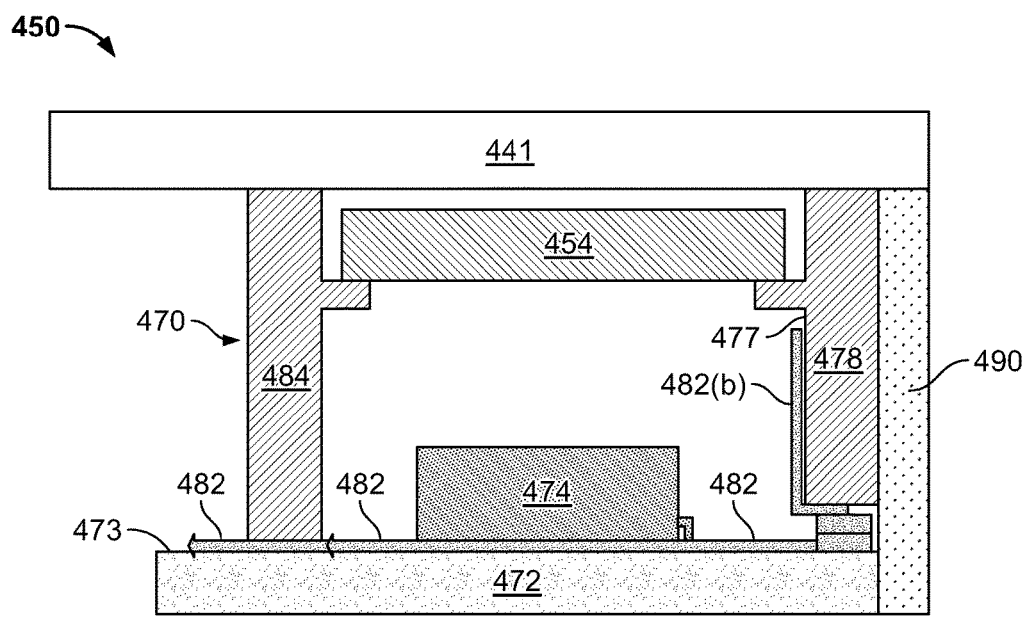
FIG. 4 shows a side view of an imaging sensor assembly that includes transverse circuit boards.

Referring to FIG. 4, an example imagining sensor assembly 450 contains a PCB assembly 470 including multiple PCBs and an integrated circuit board. PCB assembly 470 includes a first PCB 472, a second PCB 478, an integrated circuit board 474, and a plurality of electric traces 482 extending between first, second, and third circuit boards 472, 478, 484 and integrated circuit 474. First, second, and third PCBs 472, 478, 484 can be rigid PCBs, flexible PCBs, or combinations thereof.

First PCB 472 includes a major face 473 defined along an X-Z plane. Major face 473 of first PCB 372 can be fixedly coupled to second PCB 478, third PCB 484, and integrated circuit 474. Second and third PCBs 478, 484 can each be situated in a transverse position relative to first PCB 472. Furthermore, as shown in FIG. 4, third PCB 484 is situated in a coplanar position relative to second PCB 478 and a transverse position relative to first PCB 472.

Still referring to FIG. 4, first and second PCBs 472, 478 can be rigid PCBs in some circumstances. For example, rigid second PCB 478 can be situated in a transverse position relative to rigid first PCB 472 by a fastener, adhesive, solder, or support structure 490 that secures an edge 488 of rigid second PCB 478 to major face 473 of rigid first PCB 472.

Similarly, third PCB 484 can be a rigid third PCB 484 situated in a transverse position relative to rigid first PCB 472 such that an edge (not visible) of rigid third PCB 484 is secured to major face 473 of rigid first PCB 472.

Certain embodiments of the PCB assemblies provided herein include molded interconnect devices (MID). MIDs are plastic parts with integrated electronic circuit traces that have been applied using laser direct structuring (LDS). LDS is a process of activating non-conductive metallic inorganic materials that reside within a doped thermoplastic material, in which activation forms micro-rough tracks on the thermoplastic material. These tracks are subsequently filled with a conductive material to form electrical traces on the thermoplastic material. For example, PCB assembly 470 can include a rigid first PCB 472 coupled to second and third PCBs 478, 484 that are MID components. Second and third PCBs 478, 484 can thus provide a dual function of providing a pathway for electrical traces 482 as well as providing structural support to other components within the electronic device. For example, as shown in FIG. 4, second and third PCBs 478, 484 can provide structural support to position a lens module 454 (through which light passes on its way to integrated circuit 474) proximate a transparent top housing 441 of an electronic device, while also allowing electric traces 482 to extend across or through second and third PCBs 478, 484 to first PCB 472.

Still referring to FIG. 4, electrical traces 482 of PCB assembly 470 can include one or more portions extending through different pathways to and/or from first PCB 472, second PCB 478, and integrated circuit 474. For example, a first portion of an electrical trace can extend across first PCB 472 from integrated circuit 474 to second PCB 478, while a second portion of the electrical trace 482(b) extends from first PCB 472 across second PCB 478, and back to first PCB 478.

Electrical traces 482 of PCB assembly 470 can extend across one or more PCBs 472, 478, 484 through various pathways. In various embodiments, any one electrical trace 482 or a portion of an electrical trace 482 can extend across a surface of a PCB (as shown in FIG. 4), or, in some embodiments, through an interior of a PCB (not shown). For example, for each of the plurality of electrical traces 482 of PCB assembly 470, the second portion 482(b) of the respective electrical trace can run from the edge 488 of rigid second PCB 478 to its major face 473 without running through an interior of the second rigid PCB 478. In some embodiments, for each of the plurality of electrical traces, the second portion 482(b) of an electrical trace 482 can run from edge 488 of rigid second PCB 478 to major face 477 of rigid second PCB 478 through the interior of second rigid PCB 478.

For any plurality of electrical traces 482 within PCB assembly 470, a portion of an electrical trace can extend across any of the PCBs with or without connecting to an electrical component. For example, for each of the plurality of electrical traces, the second portion 482(b) of the respective electrical trace extends across rigid second PCB 478 without connecting to any electrical component.

Figure 5A:
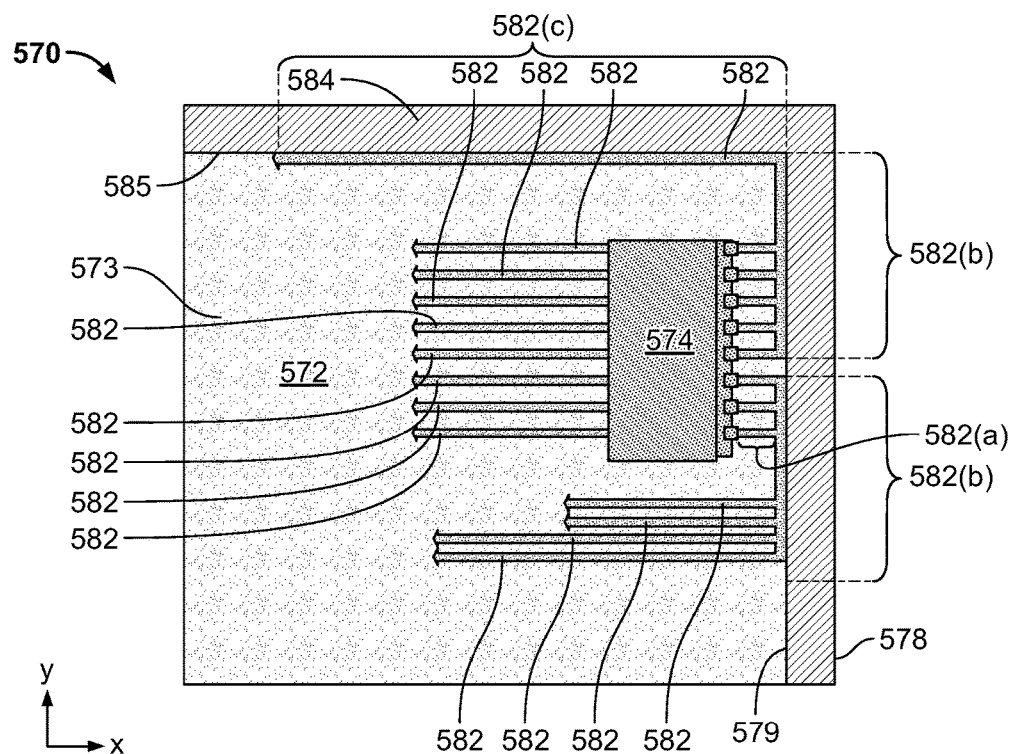
FIGS. 5A and 5B show plan and side views of a PCB assembly including multiple transverse circuit boards.
Figure 5B:
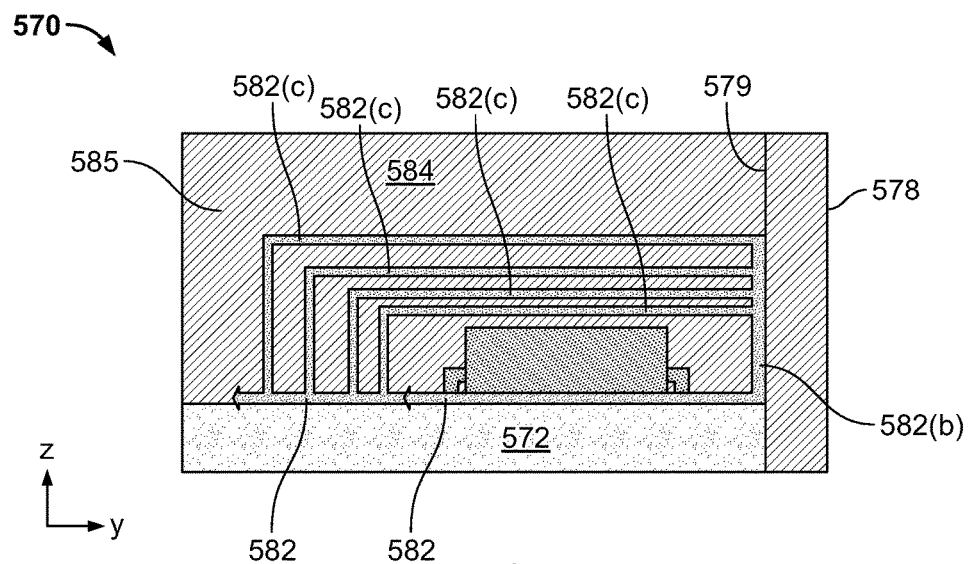

Referring to FIGS. 5A-5B, an example PCB assembly 570 includes multiple PCBs 572, 578, 584 and an integrated circuit board 574. PCB assembly 570 includes a first PCB 572, a second PCB 578, a third PCB 584, an integrated circuit 574, and a plurality of electric traces 582 extending between the various PCBs 572, 578, 584 and integrated circuit 574. First, second, and third PCBs 572, 578, 584 can be rigid PCBs, flexible PCBs, or combinations thereof.

First PCB 572 includes a major face 573 that extends along an X-Y plane. In various embodiments provided herein, major face 573 of first PCB 572 can be coupled to second PCB 578, third PCB 584, and integrated circuit 574. Second and third PCBs 578, 584 can be situated in a transverse position relative to first PCB 572 such that corresponding major faces 579, 585 of second and third PCBs 578, 584 can extend along an X-Z or a Y-Z plane. Furthermore, as shown in FIGS. 5A-5B, third PCB 584 can be situated in a transverse position relative to both first and second PCBs 572, 578 (e.g., in embodiments in which the first and second PCBs are a single, flexible PCB that is bent, relative to the unbent and bent portions of the flexible PCB).

Still referring to FIG. 5, electrical traces 582 of PCB assembly 570 can include one or more portions 582(a), (b), (c) extending through different pathways to or from first PCB 572, second PCB 578, third PCB 584, or integrated circuit 574. For example, in some embodiments, a first portion 582(a), as best shown in FIG. 5A, of an electrical trace 582 can extend across first PCB 572 between integrated circuit 574 and second PCB 578. A second portion 582(b) of the electrical trace 582 can extend from first PCB 572 across second PCB 578, and back to first PCB 578. In some embodiments, second portion 582(b) of the respective electrical trace 582 can extend from first PCB 572 across second PCB 578 and to third PCB 584. A third portion 582(c) of the electrical trace 582 can extend across third PCB 584 from second PCB 578 to a location other than the integrated circuit, such as fourth PCB or other electronic component (not shown).

Referring to FIG. 6, an example PCB assembly 670 with an integral securing component 690 is shown. PCB assembly 670 includes a first PCB 672, a second PCB 678, and securing component 690 that secures second PCB 678 in a transverse position relative to first PCB 672. Securing component 390 can optionally include an adhesive bond, solder, one or more fasteners, or combinations thereof, to secure itself to first or second PCB 672, 678.

First PCB 672 has a first major face 671 and a second major face 673. Securing component 690 couples to first major face 673 of first PCB 672 and a major face 679 of second PCB 678 such that a side edge 681 of second PCB 678 abuts second major face 673 of first PCB 672.

First and second PCBs 672, 678 are both rigid PCBs, in some embodiments. In such embodiments, rigid second PCB 678 can be situated in a transverse position relative to rigid first PCB 672. Alternatively, in some embodiments, first PCB 672 and second PCB 678 are portions of a single flexible PCBs (in such case the bend would be less absolute than illustrated in FIG. 6).

Securing component 690, as depicted in FIG. 6, is an L-shaped component with first and second portions 692, 694. First portion 692 can be coplanar with first PCB 672. Second portion 694 can be coplanar with second PCB 678 and transverse to first PCB 672. Securing component 690 can include a single integral component, as shown in FIG. 6. In some embodiments, securing component 690 can include multiple abutment portions in which each abutment portion is extends either along a plane that is coplanar to first PCB 672, or a plane that is coplanar to second PCB 678. First portion 692 can be bonded to first major face 671 of first PCB 672 and second portion 694 can be bonded to major face 679 of second PCB 678.

Referring to FIG. 7, an example PCB assembly 770 including multiple securing components is 792, 794 shown. PCB assembly 770 can include a PCB 772 that includes a first portion 773 and a second portion 778. PCB assembly 770 also includes first and second securing components 792, 794 to secure the second portion 778 in a transverse position relative to the first portion 773. As shown in FIG. 7, the second portion of the flexible PCB 778 can be situated in the transverse position relative to the first portion of the flexible PCB 773 by bending a portion of the flexible PCB 772 at a desired angle (e.g., approximately 90 degrees).

PCB assembly 770 can include multiple separate, discrete securing components 792, 794. For example, in some embodiments, first securing component 792 can provide support to primary portion 773 and second securing component 794 can provide support to extended portion 778. As shown in FIG. 7, second securing component 794 can secure the second portion of flexible PCB 778 in a transverse position relative to the first portion 773 by attaching to the flexible PCB at a surface 795 of second securing component 794. First and second securing components 792, 794 can be made of various materials, such as polymers (e.g., polycarbonate, PEEK, and PET), metal (e.g., stainless steel, titanium, silver, gold, and alloys or combinations thereof), and ceramics.

While this specification contains many specific implementation details, these should not be construed as limitations on the scope of the disclosed technology or of what may be claimed, but rather as descriptions of features that may be specific to particular embodiments of particular disclosed technologies. Certain features that are described in this specification in the context of separate embodiments can also be implemented in combination in a single embodiment in part or in whole. Conversely, various features that are described in the context of a single embodiment can also be implemented in multiple embodiments separately or in any suitable subcombination. Moreover, although features may be described herein as acting in certain combinations and/or initially claimed as such, one or more features from a claimed combination can in some cases be excised from the combination, and the claimed combination may be directed to a subcombination or variation of a subcombination. Similarly, while operations may be described in a particular order, this should not be understood as requiring that such operations be performed in the particular order or in sequential order, or that all operations be performed, to achieve desirable results. Particular embodiments of the subject matter have been described. Other embodiments are within the scope of the following claims.

What is claimed is:

1. A mobile computing device, comprising:
   a device housing;
   a first printed circuit board that is fixed relative to the device housing;
   an integrated circuit that is connected to the first printed circuit board;
   a second printed circuit board that is situated in a transverse position relative to the first printed circuit board, wherein the second printed circuit board is separate from the first printed circuit board;
   a plurality of electrical traces, wherein each respective electrical trace from the plurality of electrical traces includes:
   (i) a first portion that extends across the first printed circuit board, between the integrated circuit and the second printed circuit board,
   (ii) a second portion that extends across the second printed circuit board, between the first printed circuit board and either the first printed circuit board or a third printed circuit board, and (iii) a third portion that extends across either the first printed circuit board or the third printed circuit board, between the second printed circuit board and a location other than the integrated circuit; and a securing component that secures the second printed circuit board in the transverse position relative to the first printed circuit board.

2. The mobile computing device of claim 1, wherein:
the first printed circuit board comprises a rigid first printed circuit board;
the second printed circuit board comprises a rigid second printed circuit board that is different from the rigid first printed circuit board; and
the rigid second printed circuit board is situated in the transverse position relative to the rigid first printed circuit board.

3. The mobile computing device of claim 2, wherein the securing component that secures the rigid second printed circuit board in the transverse position relative to the rigid first printed circuit board includes a fastener or adhesive or solder that secures an edge of the rigid second printed circuit board to a major face of the rigid first printed circuit board.

4. The mobile computing device of claim 3, wherein, for each of the plurality of electrical traces, the second portion of the respective electrical trace extends from the edge of the rigid second printed circuit board to a major face of the rigid second printed circuit board without running through an interior of the second rigid printed circuit board.

5. The mobile computing device of claim 3, wherein, for each of the plurality of electrical traces, the second portion of the respective electrical trace extends from the edge of the rigid second printed circuit board to a major face of the rigid second printed circuit board through an interior of the second rigid printed circuit board.

6. The mobile computing device of claim 1, wherein:
for each electrical trace in a first subset of the plurality of electrical traces, the second portion of the respective electrical trace turns in a first direction on the second printed circuit board;
for each electrical trace in a second subset of the plurality of electrical traces, the second portion of the respective electrical trace turns in a second direction on the second printed circuit board;
the second direction is opposite the first direction.

7. The mobile computing device of claim 1, wherein each of the plurality of electrical traces includes:
the second portion of the respective electrical trace that extends across the second printed circuit board, between the first printed circuit board and the first printed circuit board; and
the third portion of the respective electrical trace that extends across the first printed circuit board, between the second printed circuit board to the location other than the integrated circuit.

8. The mobile computing device of claim 1, wherein each respective electrical trace of the plurality of electrical traces includes:
the second portion that extends across the second printed circuit board, between the first printed circuit board and the third printed circuit board; and
the third portion that extends across the third printed circuit board, between the second printed circuit board and a location other than the integrated circuit.

9. The mobile computing device of claim 8, wherein:
the third printed circuit board is situated in a transverse position relative to the second printed circuit board; and
the third printed circuit board is situated in a coplanar position relative to the first printed circuit board.

10. The mobile computing device of claim 8, wherein:
the third printed circuit board is situated in a transverse position relative to the second printed circuit board; and
the third printed circuit board is situated in a transverse position relative to the first printed circuit board.

11. A mobile computing device, comprising:
a device housing;
a first printed circuit board that is fixed relative to the device housing;
an integrated circuit that is connected to the first printed circuit board;
a second printed circuit board that is situated in a transverse position relative to the first printed circuit board,
a plurality of electrical traces, wherein each respective electrical trace from the plurality of electrical traces includes:
(i) a first portion that extends across the first printed circuit board, between the integrated circuit and the second printed circuit board,
(ii) a second portion that extends across the second printed circuit board, between the first printed circuit board and either the first printed circuit board or a third printed circuit board, and
(iii) a third portion that extends across either the first printed circuit board or the third printed circuit board, between the second printed circuit board and a location other than the integrated circuit; and
a securing component that secures the second printed circuit board in the transverse position relative to the first printed circuit board, wherein the integrated circuit comprises an imaging sensor.

12. The mobile computing device of claim 2, wherein the securing component further secures an imaging filter or imaging lens in front of the imaging sensor.

13. The mobile computing device of claim 12, wherein the securing component that secures the second portion of the flexible printed circuit board in the transverse position relative to the first portion of the flexible printed circuit board attaches to the second portion of the flexible printed circuit board at a surface of the securing component that has a transverse orientation relative to the first portion of the flexible printed circuit board.

14. A mobile computing device, comprising:
a device housing;
a first printed circuit board that is fixed relative to the device housing;
an integrated circuit that is connected to the first printed circuit board;
a second printed circuit board that is situated in a transverse position relative to the first printed circuit board,
a plurality of electrical traces, wherein each respective electrical trace from the plurality of electrical traces includes:
(i) a first portion that extends across the first printed circuit board, between the integrated circuit and the second printed circuit board,
(ii) a second portion that extends across the second printed circuit board, between the first printed circuit board and either the first printed circuit board or a third printed circuit board, and
(iii) a third portion that extends across either the first printed circuit board or the third printed circuit board, between the second printed circuit board and a location other than the integrated circuit; and a securing component that secures the second printed circuit board in the transverse position relative to the first printed circuit board, wherein, for each of the plurality of electrical traces, the second portion of the respective electrical trace extends across the second printed circuit board without connecting to an electrical component.

15. An assembly of electrical components, comprising:

a first printed circuit board that is fixed relative to a device housing;

an integrated circuit that is connected to the first printed circuit board;

a second printed circuit board that is situated in a transverse position relative to the first printed circuit board, a plurality of electrical traces, wherein each respective electrical trace from the plurality of electrical traces includes:

(i) a first portion that extends across the first printed circuit board, between the integrated circuit and the second printed circuit board, (ii) a second portion that extends across the second printed circuit board, between the first printed circuit board and the first printed circuit board, wherein the second portion of the respective trace extends across the second printed circuit board without connecting to an electrical component, and (iii) a third portion that extends across the first printed circuit board, between the second printed circuit board and a location other than the integrated circuit; and a securing component that secures the second printed circuit board in the transverse position relative to the first printed circuit board, wherein:

each electrical trace in a first subset of the plurality of electrical traces turns in a first direction on the second printed circuit board, and each electrical trace in a second printed subset of the plurality of electrical traces turns in a second direction on the second printed circuit board that is different from the first direction.

16. The assembly of electrical components of claim 15, wherein:

the first printed circuit board comprises a first portion of a flexible printed circuit board; the second printed circuit board comprises a second portion of the flexible printed circuit board;

wherein the second portion of the flexible printed circuit board is situated in the transverse position relative to the first portion of the flexible printed circuit board.

17. The assembly of electrical components of claim 15, wherein:

the first printed circuit board comprises a rigid first printed circuit board;

the second printed circuit board comprises a rigid second printed circuit board that is different from the rigid first printed circuit board; and the rigid second printed circuit board is situated in the transverse position relative to the rigid first printed circuit board.

18. The assembly of electrical components of claim 17, wherein, for each of the plurality of electrical traces, the second portion of the respective electrical trace runs from an edge of the rigid second printed circuit board to a major face of the rigid second printed circuit board without running through an interior of the second rigid printed circuit board.

19. The assembly of electrical components of claim 15, wherein each respective electrical trace of the plurality of electrical traces includes:

the second portion that extends across the second printed circuit board, between the first printed circuit board and a third printed circuit board; and the third portion that extends across the third printed circuit board, between the second printed circuit board and a location other than the integrated circuit.

* * * * *